(12) United States Patent
Dening

(10) Patent No.: US 6,333,677 B1
(45) Date of Patent: Dec. 25, 2001

(54) LINEAR POWER AMPLIFIER BIAS CIRCUIT

(75) Inventor: David C. Dening, Stokesdale, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/684,825

(22) Filed: Oct. 10, 2000

(51) Int. Cl.$^7$ .................................................. H03F 3/04
(52) U.S. Cl. ................................. 330/296; 330/285
(58) Field of Search ........................... 330/285, 296, 330/302

(56) References Cited

U.S. PATENT DOCUMENTS

| | | | |
|---|---|---|---|
| 3,991,381 | 11/1976 | Sechi | 330/35 |
| 5,359,296 | 10/1994 | Brooks et al. | 330/288 |
| 5,404,585 | * 4/1995 | Vimpari et al. | 455/115 |
| 5,570,065 | 10/1996 | Eberhardt et al. | 330/296 |
| 5,808,511 | 9/1998 | Kobayashi | 330/149 |
| 6,018,270 | 1/2000 | Stuebing et al. | 330/278 |
| 6,043,714 | 3/2000 | Yamamoto et al. | 330/296 |
| 6,052,032 | 4/2000 | Järvinen | 330/289 |
| 6,114,912 | * 9/2000 | Ashby et al. | 330/296 |

* cited by examiner

Primary Examiner—Robert Pascal
Assistant Examiner—Henry Choe
(74) Attorney, Agent, or Firm—Withrow & Terrenova, P.L.L.C.

(57) ABSTRACT

A bias circuit suitable for use with a radio frequency linear power amplifier compensates for amplifier gain compression by providing bias current responsive to an amplitude of an RF signal to be amplified at a bias current gain greater than unity. The bias circuit comprises a minimal number of active and passive components and is suitable for implementation in a range of process technologies. Bias current gain may be configured over a range of less than to greater than unity gain by adjusting a reference voltage supplied to the bias circuit and by adjusting a resistor value included within the bias circuit. In implementation, the bias circuit is configured to have a bias current gain that complements a characteristic gain compression associated with a particular radio frequency power amplifier.

41 Claims, 8 Drawing Sheets

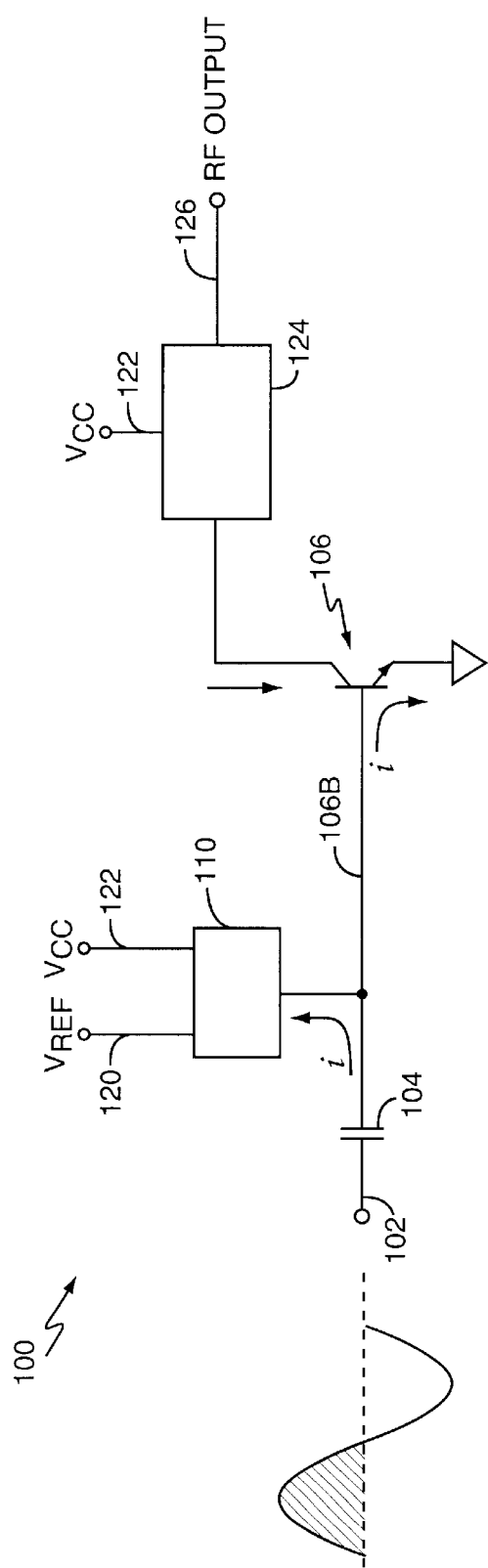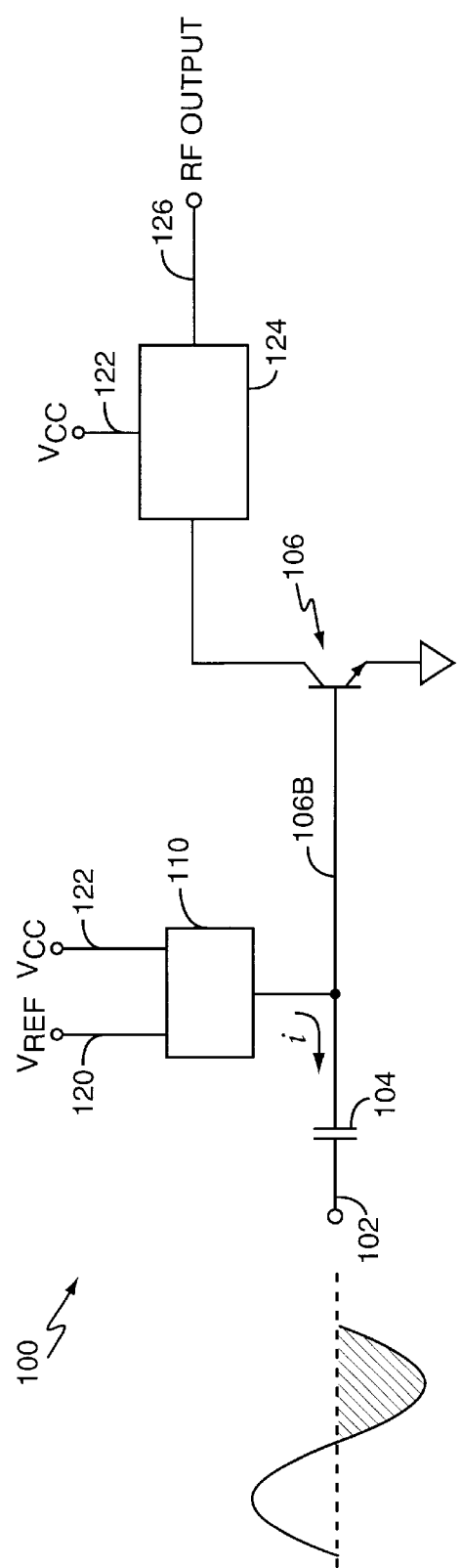
FIG. 6A
FIG. 6B

LINEAR POWER AMPLIFIER BIAS CIRCUIT

FIELD OF THE INVENTION

The present invention relates to radio frequency linear power amplifiers and particularly relates to providing a bias circuit for such amplifiers.

BACKGROUND

Wireless communications represent an enabling technology for modern culture. While there are seemingly endless varieties of wireless communication devices such as cellular telephones, two-way pagers, and wireless personal digital assistants, all such devices incorporate essentially common functionality. Information, voice or otherwise, is transmitted between a given wireless device and a remote user or system through a supporting wireless communications network. With the increasing popularity of wireless communication devices, designers are forced to devise methods of supporting ever-increasing numbers of device users in a finite bandwidth.

Most contemporary schemes for supporting a large number of communication device users within a given bandwidth are based on digital transmission techniques. Unlike conventional analog communications systems, such as the North American Advanced Mobile Phone System standard (AMPS), the newer digital transmission standards involve both envelope and phase (or frequency) modulation techniques, and require precise transmit power control. Whereas a communications device transmitting under the AMPS standard typically used a power amplifier biased for saturated or quasi-saturated operation, digital transmission standards impose strict requirements for transmitted signal fidelity and transmitted signal power, as well as strict limitations on adjacent channel power, which is a measure of interference between adjacent radio channels. These strict standards mandate the use of linear or quasi-linear power amplifiers. Appropriate amplifier bias networks are critical in achieving acceptable amplifier performance.

Power control is an essential element in most digital transmission schemes. Oftentimes, the transmitted signal power must vary linearly over a range of as much as 35 dB. One method of achieving transmit signal power control involves varying the amplitude of the radio frequency signal to be amplified by the power amplifier, while configuring the power amplifier to have a fixed gain. Thus, an associated bias network must provide the correct amount of amplifier bias current over widely ranging input and output signal magnitudes. This type of bias network must typically support both small and large signal operation of the associated power amplifier. Ideally, the bias circuit provides bias current proportional to the input signal—the radio frequency signal to be amplified—power or amplitude over the expected input signal range. Obviously, at the highest levels of input signal power, significant bias current magnitude may be required from the bias network in order for the power amplifier to linearly amplify the input signal.

For some types of power amplifiers, the power amplifier process technology has intrinsic characteristics that can reduce the amount of bias current required from the bias network with increasing input signal power. Power amplifiers implemented using gallium arsenide (GaAs) heterojunction bipolar transistor (HBT) technology exhibit increasing gain with increasing emitter current density. Essentially, HBT amplifiers require proportionately less bias current at higher levels of output power. Other types of process technologies do not exhibit similar characteristics.

For example, silicon germanium (SiGe) is a promising process technology in that it allows the integration of logic gates and power transistors, while exhibiting good high frequency characteristics. However, bipolar transistors implemented in SiGe tend to exhibit gain compression, in which their gain tends to fall or at least flatten beyond a certain level of output signal power. Indium phosphide (InP) represents another otherwise promising power amplifier process technology exhibiting similar problems with gain compression.

Ideally, the bias network would provide adequate bias current to insure linear or quasi-linear operation across the full range of operating power for the power amplifier. Because of gain compression, however, the magnitude of bias current required at higher power levels is significant. Existing approaches to linear amplifier bias network design are not adapted to provide such significant levels of bias current. Because of the radio frequency signals involved, and because of cost and design considerations, power amplifier bias networks for use in portable communication devices should involve as few components as possible, and should adopt relatively straightforward circuit architectures.

Accordingly, there remains a need for an economical linear power amplifier bias network that embodies the desirable characteristics of low component count and good radio frequency signal response, while being able to provide the significant levels of bias current necessary for certain types of transistor power amplifiers. Ideally, such a bias network would be configurable so that it could be made compatible with a wide range of power amplifier types, having a broad range of bias current requirements. In order to satisfy the need for significant bias currents at high levels of output power, the needed bias circuit architecture must be configurable to have a bias current gain that may be adjusted to greater than unity if needed in a particular application.

SUMMARY

The present invention relates to a bias circuit suitable for use with a radio frequency power amplifier. Arranged in a modified current mirror configuration with the power amplifier, the bias circuit provides a configurable bias current gain that may be set for greater than unity bias current gain. Providing greater than unity bias current gain allows the bias circuit to provide substantial levels of bias current at high levels of power for the RF signal to be amplified, thus compensating for amplifier gain compression. Preferably, the bias circuit is used with an AC-coupled power amplifier and comprises a first transistor connected in a current mirror configuration with the power amplifier. This first transistor is driven by the input RF signal to be amplified and, in turn, drives a second transistor that provides varying levels of bias current responsive to the input RF signal. The amount of bias current provided by the bias circuit is proportional to the average power of the input RF signal and increases and decreases in response to negative and positive voltage swings, respectively, of the input RF signal.

On positive-going swings of the input signal, the AC-coupling capacitor or capacitors discharge into the base of the power device, thereby providing drive current for the power amplifier. On negative-going swings of the input signal, the bias circuit provides current to recharge the coupling capacitor. In order to maintain amplifier linearity and minimize amplified signal distortion, the bias circuit provides proportional charging of the coupling capacitor over a full range of input signal amplitudes (power). Its ability to provide adequate charging current to the coupling capacitor at very high levels of input signal power derives from the bias circuit's modified current mirror configuration, which provides for bias current gain greater than unity.

Such bias current gain is not required, and indeed, may be undesirable for certain kinds of power amplifiers. For example, radio frequency power amplifiers based on gallium arsenide (GaAs) heterojunction bipolar transistors (HBTs) actually experience, to a point, increasing gain (beta) with increasing emitter current densities. For such amplifiers, amplifier gain may actually increase with increasing input signal power. The present bias circuit may be configured to provide less than unity bias current gain for compatibility with HBT power amplifiers, or other types of bias circuit may be used. However, radio frequency power amplifiers implemented in other process technologies do exhibit potentially significant gain compression, and it is with such types of power amplifiers that the bias circuit of the present invention is particularly advantageous. Examples of such amplifiers include power amplifiers implemented in Silicon Germanium (SiGe) or in Indium Phosphide (InP). With such process technologies, the bias circuit of the present invention provides gain compression compensation to insure acceptable amplifier performance over a range of input signal power.

While retaining its basic modified current mirror configuration, the bias circuit of the present invention may be modified in accordance with various semiconductor layout techniques, including amplifier cell fabrication. In amplifier cell fabrication, a plurality of transistor cells is arranged in parallel to form a composite transistor amplifier. In such configurations, the bias circuit of the present invention may be replicated for each transistor cell. Other aspects and features of the present invention will become apparent to those ordinarily skilled in the art upon review of the following description of exemplary embodiments of the invention in conjunction with the accompanying figures.

BRIEF DESCRIPTION OF THE DRAWINGS

FIGS. 6A and 6B illustrate one aspect of operation for the bias circuits of FIGS. 5A, B, C, and D.

DETAILED DESCRIPTION OF THE INVENTION

Figure 1:
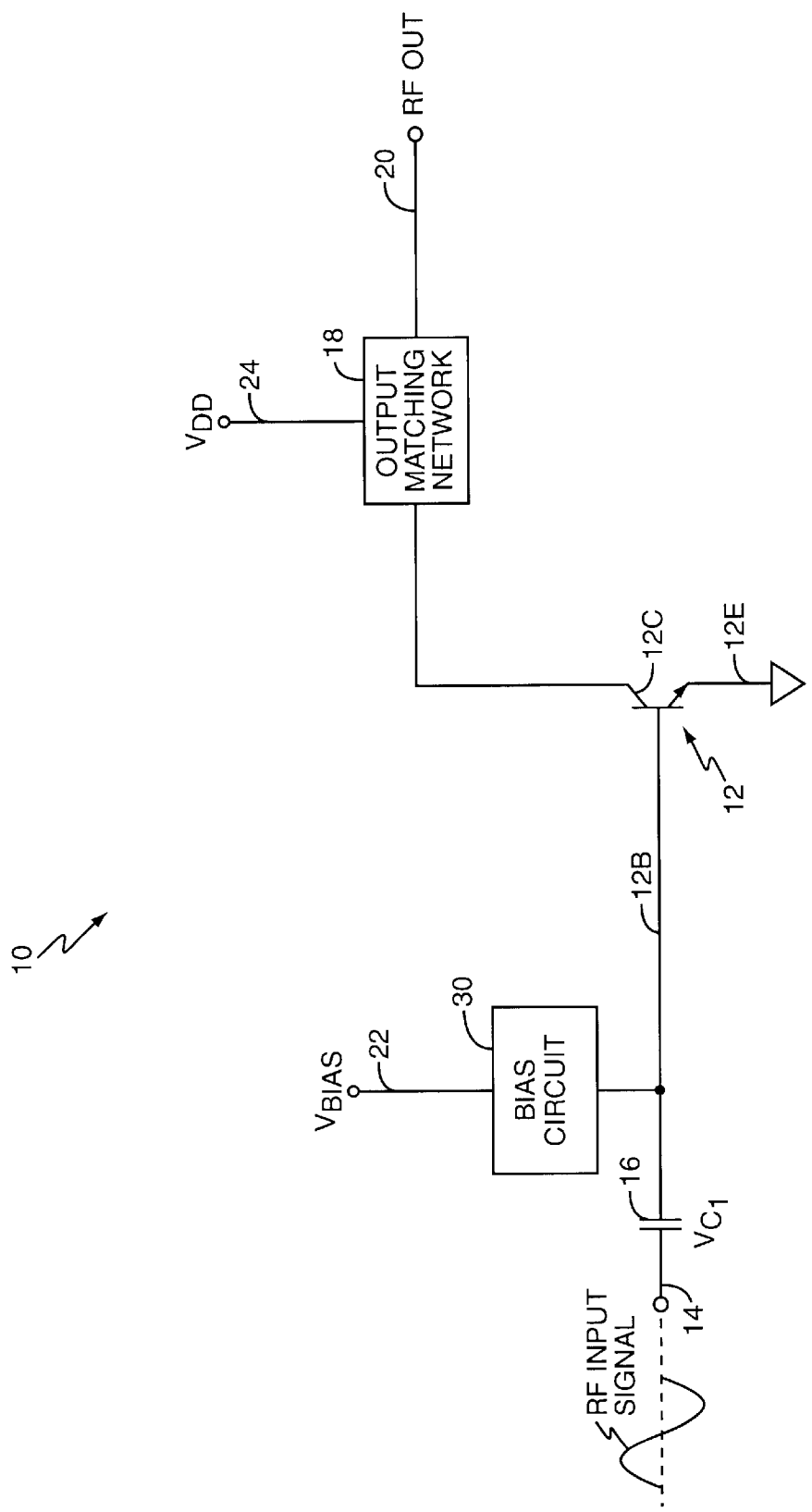
FIG. 1 illustrates a generalized approach to linear power amplifier biasing.

FIG. 1 depicts a transistor amplifier network 10 and includes a transistor power amplifier 12, including a collector 12C, base 12B, and emitter 12E, an RF signal input 14, an input coupling capacitor 16, an output matching network 18, an RF signal output 20, a bias voltage source 22, an operating voltage source 24, and a generalized bias circuit 30. The radio frequency (RF) signal to be amplified is coupled to the RF signal input 14 and couples through the input coupling capacitor 16, which action drives the base node 12B of the transistor power amplifier 12. When properly biased by the bias circuit 30, the transistor power amplifier 12 produces a collector current at 12C that is responsive to the input RF signal. Output current derives from the operating voltage supply 24, which may be coupled to the transistor power amplifier collector 12C through the output-matching network 18. While the particular behavior of the generalized bias circuit 30 varies with design requirements, it is generally required to provide enough bias current to maintain the transistor power amplifier 12 in a linear mode of operation over the range of input RF signal amplitude. Using the output-matching network 18, the impedance of the load (e.g., an antenna) is transformed to the desired impedance for optimum performance of the transistor power amplifier 12.

Figure 2:
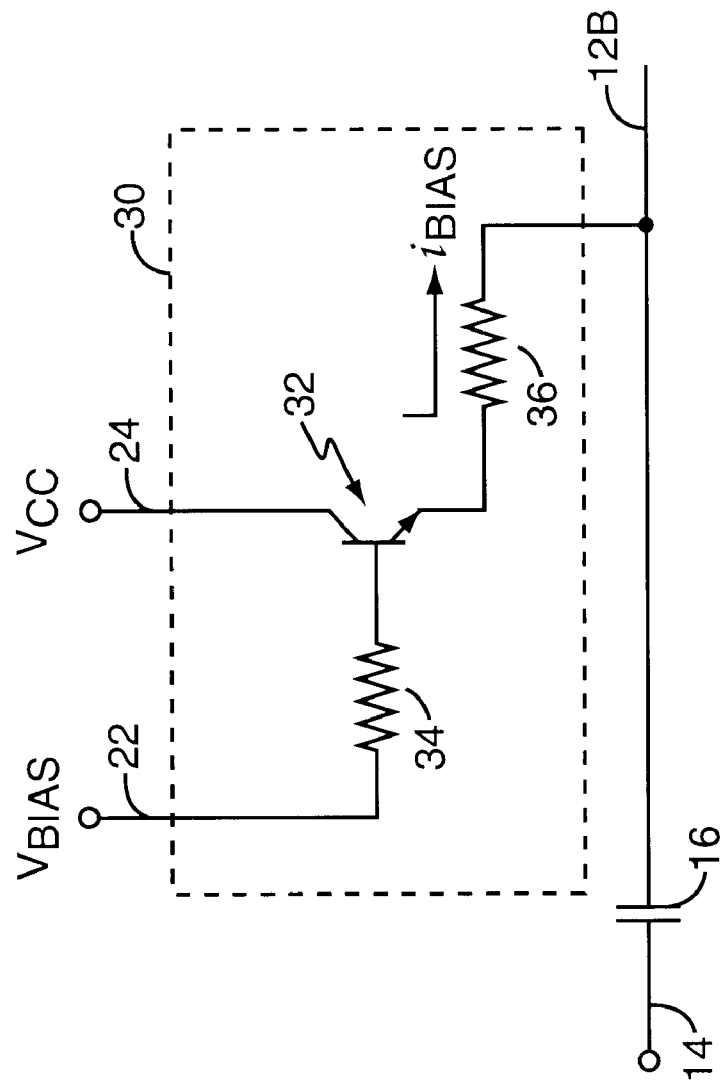
FIG. 2 provides additional details for the existing bias network of FIG. 1.

FIG. 2 illustrates a simplified but typical arrangement for the generalized bias circuit 30 of FIG. 1. A bias transistor 32 operates in an emitter-follower configuration. The bias transistor 32 is supplied base current from the bias supply voltage 22 through resistor 34, and is supplied collector current from an operating supply voltage 24 ($V_{cc}$). The base drive turns the bias transistor 32 on, which allows it to provide bias current to the base (12B) of the transistor power amplifier 12 through resistor 36. Bias current provided by the bias circuit 30 to the transistor power amplifier 12 may be adjusted by selecting appropriate values of resistors 34 and 36, and also by adjusting the level of the bias supply voltage 22.

However, in actual systems employing a power amplifier, such as the transistor power amplifier 12, there are oftentimes severe limits on the ability to adjust or raise the bias supply voltage because such systems are commonly battery powered and subject to significant restrictions on power consumption. There are also practical lower limits on the values of resistors 34 and 36, as the amount of quiescent bias current—the bias current at low or zero input signal levels—supplied by the bias circuit 30 must be kept at manageably low levels. With these practical design considerations, the less-than-unity bias current gain imposed by the basic emitter-follower configuration of the bias circuit 30 can be problematic when paired with certain types of transistor power amplifiers 12. Specifically, certain types of transistor power amplifiers 12 exhibit gain compression and require substantial levels of bias current at high levels of RF input signal power to offset this characteristic.

Figure 3:
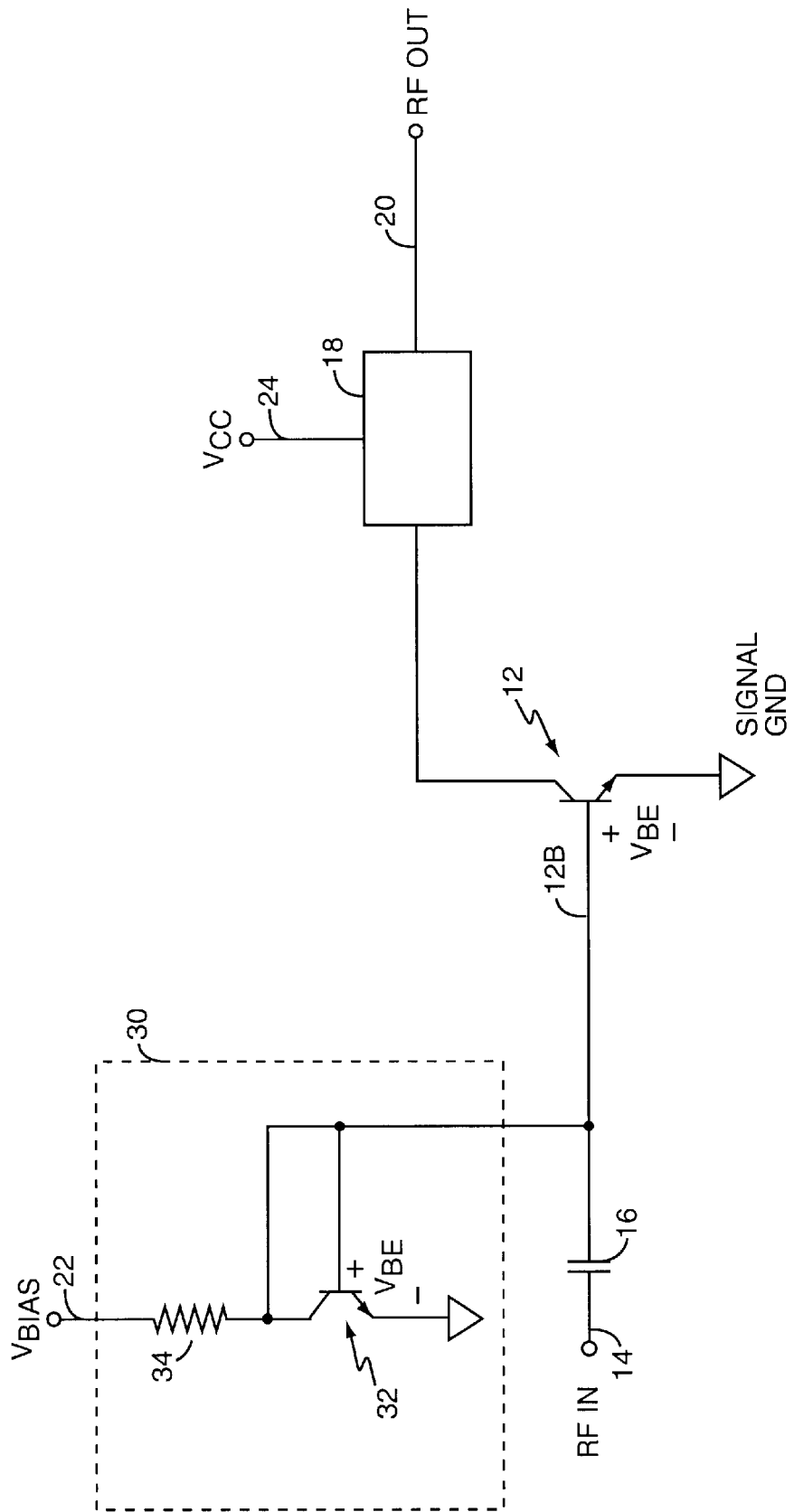
FIG. 3 illustrates an alternate approach to biasing a linear power amplifier.

FIG. 3 illustrates a different approach to biasing a power amplifier. The bias circuit 30 comprises a bias transistor 32 arranged in a current mirror configuration with the transistor power amplifier 12. The RF input signal drives the bases of both the bias transistor 32 and the transistor power amplifier 12. All bias current supplied by the bias network flows through the resistor 34, thus placing operating limits on the value of the resistor 34. For example, relatively low values of quiescent bias current impose the need for increasing the value of the resistor 34 or decreasing the voltage of the bias supply 22. However, neither of these approaches is satisfactory with respect to the need for supplying high levels of bias current through the resistor 34 as required at high levels of the RF input signal. Thus, the system designer is left with a sometimes unworkable comprise between limiting quiescent power consumption and providing adequate bias current at high input signal power levels. This problem is particularly acute when the bias circuit 30 is paired with a transistor power amplifier 12 subject to gain compression at higher output power levels.

Figure 4:
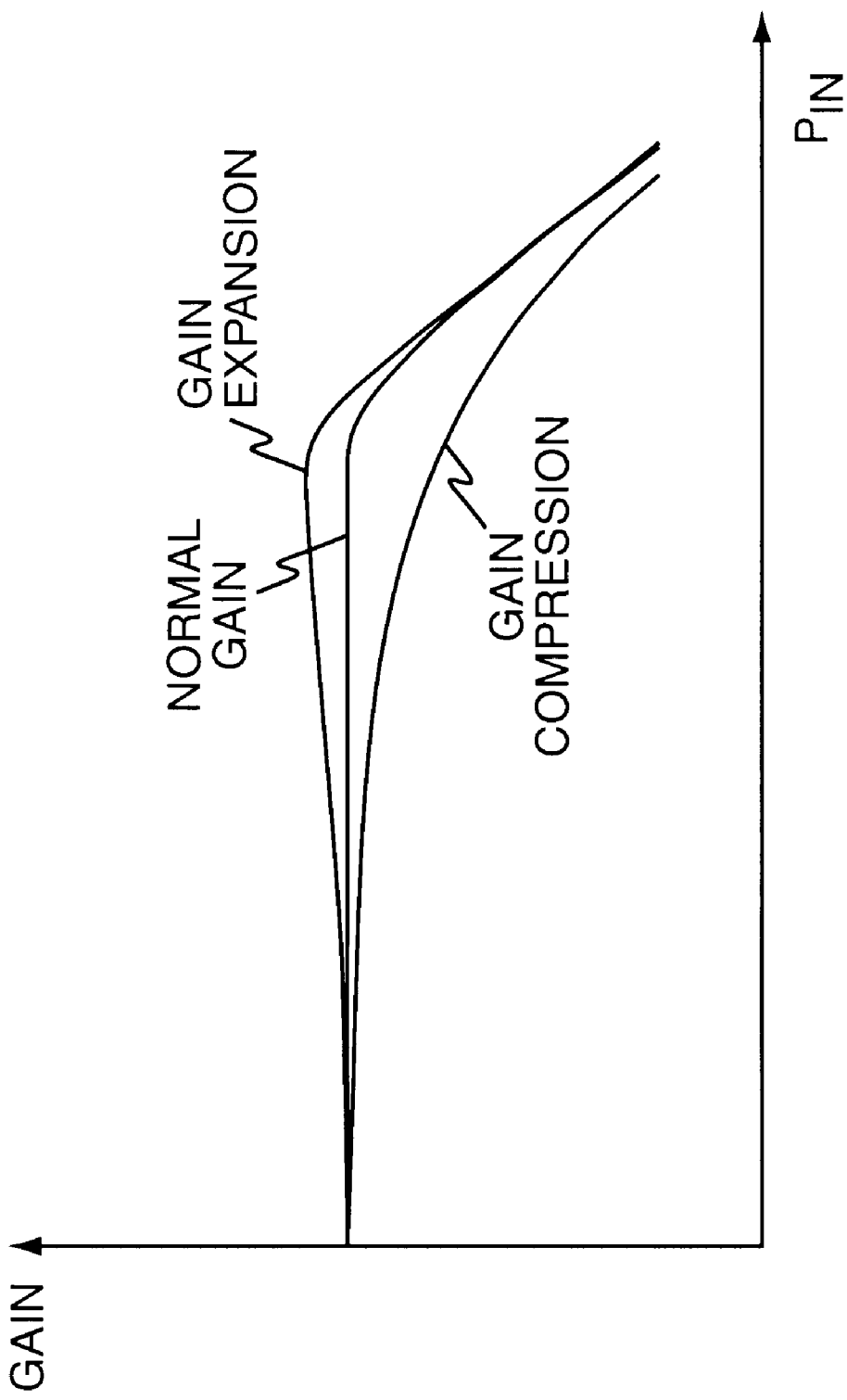
FIG. 4 illustrates the power amplifier phenomenon of gain compression and gain expansion as a function of input RF signal power.

FIG. 4 illustrates the concept of amplifier gain "compression" and "expansion." Ideally, transistor power amplifier 12 has a constant ratio of input signal power to amplified output signal power (a flat signal gain response). Thus, the proportionality of required bias current to RF input signal amplitude would remain the same independent of the input signal's actual magnitude (at least within design bounds and voltage limitations). Oftentimes, transistor power amplifiers 12 exhibit non-flat gain curves wherein more or less bias current is needed at certain RF input signal amplitudes to maintain the same input-to-output average power. When a transistor power amplifier 12 exhibits "gain expansion," the ratio of output power-to-input power increases with increasing RF input signal power. This means that the proportionality between required bias current magnitude and input signal amplitude decreases with increasing input signal amplitude.

Gain compression represents a converse phenomenon wherein a transistor power amplifier 12, beyond a certain level of input signal power, exhibits falling or flat output power. Thus, beyond that level of input signal power, the proportionality of required bias current to input signal amplitude increases. Both gain compression and gain expansion are undesirable because of their tendency to produce distortion in the output signal.

Certain types of transistor power amplifiers 12, such as those based on gallium arsenide (GaAs) heterojunction bipolar transistors (HBTs) can exhibit gain expansion due to their tendency to have increased signal gain with increasing emitter current densities. U.S. Pat. Nos. 5,608,353 and 5,629,648 to Pratt disclose an advantageous amplifier and bias circuit arrangement for an HBT power amplifier and detail practical integrated circuit implementations for such HBT amplifiers. Both of these patents are incorporated herein by reference. The tendency for HBT power amplifiers to exhibit increasing gain can alleviate the need for the bias circuit 30 to supply significant bias current at higher levels of input signal power. Thus, the relatively low (less than unity) bias current gain associated with existing bias network configurations may be acceptable. However, existing biasing approaches can be problematic when applied to power amplifiers exhibiting gain compression.

Figure 5A:
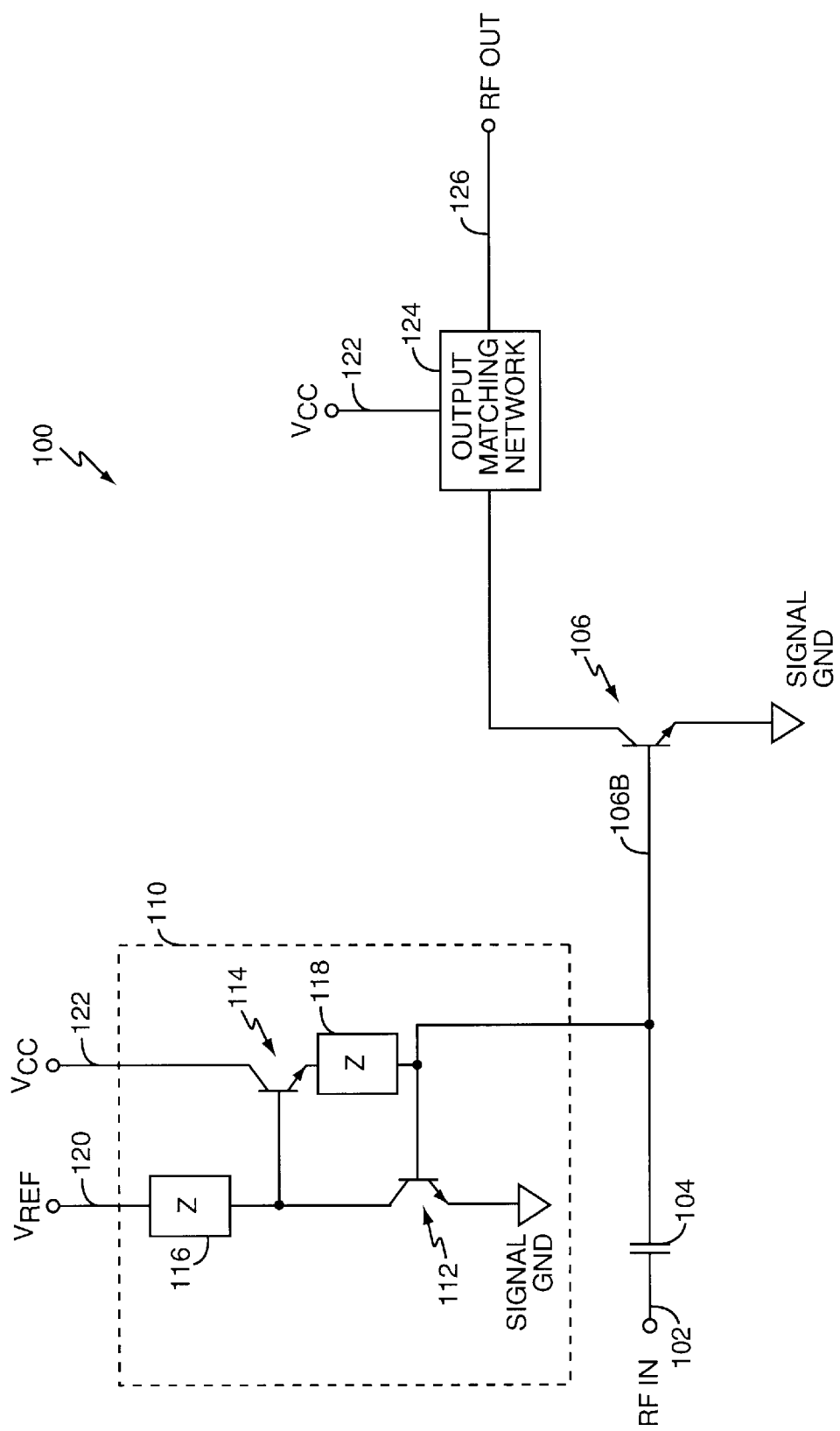
FIGS. 5A, 5B, 5C, and 5D illustrate several exemplary embodiments for the bias circuit of the present invention.

FIG. 5A illustrates an amplifier network 100 in which the present invention may be advantageously practiced. The amplifier network 100 includes a transistor power amplifier 106, an RF signal input 102, an input coupling capacitor 104, an output matching network 124, an RF signal output 126, and an exemplary embodiment of the bias circuit 110 of the present invention. Note that, as shown in later illustrations, the bias circuit 110 of the present invention is adaptable to multiple circuit and device layout configurations, and may be used in combination with parallel transistor power amplifiers and corresponding input coupling capacitors, similar to that shown in U.S. Pat. Nos. 5,608,353 and 5,629,648, previously incorporated herein by reference.

The input RF signal to be amplified is coupled to the signal input 102 and through the input coupling capacitor 104 into the bases of a first bias transistor 112 in the bias circuit 110 and the transistor power amplifier 106. Note that the first bias transistor 112 is connected in a current mirror configuration with the transistor power amplifier 106. However, the basic current mirror configuration of the first bias transistor 112 and the transistor power amplifier 106 is significantly modified through the use of a second bias transistor 114, that acts as a "balancing" transistor in the modified current mirror configuration of the bias circuit 110.

Unlike the existing bias network current mirror configurations, like that depicted in FIG. 3, the bias circuit 110 shown in FIG. 5A allows substantial flexibility in terms of adjusting quiescent current levels while still allowing the bias circuit 110 to provide substantial levels of bias current when needed by the transistor power amplifier 106. The bias circuit 110 accomplishes this with the second bias transistor 114. Rather than bias current having to flow through the impedance element 116, the second bias transistor 114 provides bias current to the base node 106B of the transistor power amplifier 106 through the impedance element 118. This allows the impedance of elements 116 and 118 to be adjusted for given values of bias reference voltage 120 and operating voltage 122, to provide a desired bias current gain and a desired quiescent bias current. Note, in the context of this discussion, the impedance elements 116 and 118 may be resistive or reactive or any combination thereof. Further note that in some embodiments of the bias circuit 110, the operating voltage 122 is connected as both a supply voltage and a bias voltage, eliminating the need for the bias reference voltage 120.

In operation, the bias circuit 110 is responsive to the RF input signal to be amplified. As the average power of the input RF signal increases, the average magnitude of the bias current provided by the bias circuit 110 increases. With the ability to configure the bias circuit 110 for bias current gains greater than unity, the bias circuit 110 can provide enough bias current at high levels of input signal power to offset any gain compression tendencies in the transistor power amplifier 106.

The base voltage and, therefore the transistor drive, of the second bias transistor 114 is a function of several variables, including the magnitude of the reference voltage 120, the impedances of impedance elements 116 and 118, and the amplitude of the RF input signal coupled into the base of the first bias transistor 112. For a given selection of transistors 112 and 114, the bias current gain—and therefore the ratio of bias current magnitude to input signal amplitude—can be set based on adjusting the values of the reference supply 120 and the impedances of 116 and 118. In general, as the impedance of the impedance element 116 increases, the bias current gain of the bias circuit 110 increases. Conversely, as the impedance of the impedance element 118 increases, the bias current gain of the bias circuit 110 decreases. This latter result arises from the degenerative feedback effect of the impedance element 118 on the operation of the transistor 114. Those skilled in the art will readily appreciate that operation of the bias circuit 110, particularly its bias current gain, may be considered from both DC and AC operating perspectives. The specific implementation of either or both impedance elements 116 and 118 may be varied to suit the needs of a particular design without deviating from the scope of the present invention. In certain implementations of the bias circuit 110, the impedance element 118 may be eliminated entirely, at the expense of some bias current gain adjustment flexibility.

As noted, a relatively large value for the impedance element 116 increases the sensitivity of the bias circuit 110 to fluctuations in the input signal because of the larger voltage drop across the impedance element 116 induced by the collector current of the transistor 112. A high beta (a transistor's small signal gain) for transistors 112 and 114 increase the sensitivity as well. For a given design, the characteristics of the particular transistor power amplifier 106, the input signal amplitude range, and the characteristics of the transistors 112 and 114 will determine the required values for the reference supply voltage 120 and the bias impedance elements 116 and 118 to achieve a desired bias current gain, which may be greater than unity (>1).

This ability to configure the bias circuit 110 of the present invention to provide bias current gain greater than unity allows it to be advantageously used with transistor power amplifiers 106 that exhibit gain compression. Indeed, the bias circuit 110 can be advantageously used with transistor power amplifiers 106 implemented in process technologies such as Silicon Germanium (SiGe) and Indium Phosphide (InP) that exhibit potentially significant gain compression at higher levels of RF input signal power. Note that the bias circuit 110 may be configured for various modes of amplifier operation. For example, for a given magnitude of reference supply voltage 120, the bias circuit 110 may be configured to provide a minimal quiescent current to the transistor power amplifier 106 such that it operates as a Class A amplifier for input signals below a given amplitude. Preferably, the bias circuit 110 is configured to operate the transistor power amplifier 106 as a Class AB power amplifier for input signals above a given amplitude.

Figure 5D:
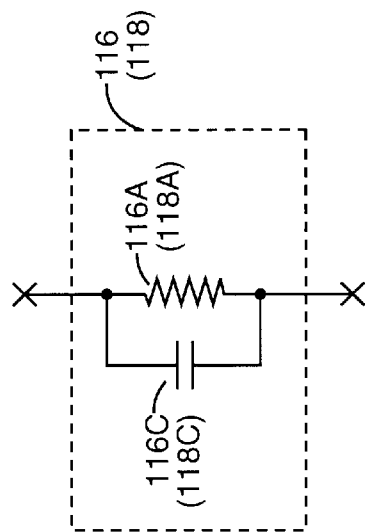
Figure 5C:
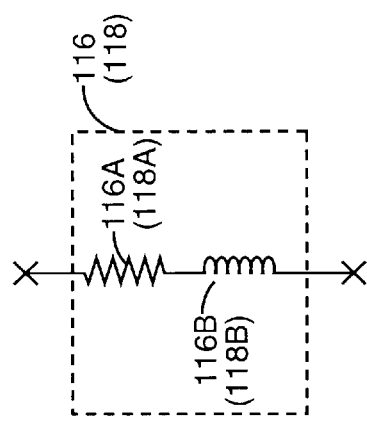
Figure 5B:
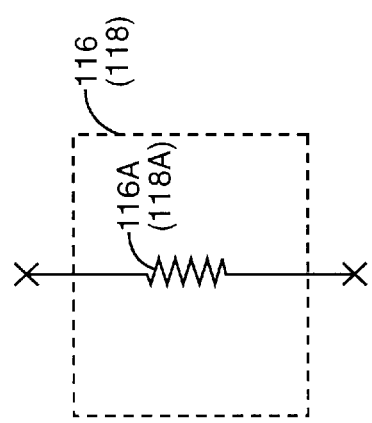

The bias circuit 110 illustrated in FIG. 5A supports many modifications that may find varying degrees of usefulness depending upon particular design requirements. For example, FIGS. 5B, 5C, and 5D illustrate exemplary variations applicable to either or both of the impedance elements 116 and 118. FIG. 5B illustrates a resistor 116A (118A) comprising the impedance element 116 (118). When implemented as a resistance, the impedance element 116 (118) imparts a consistent AC and DC gain influence on the bias circuit 110—ignoring any parasitic capacitances or signal coupling present in a physical circuit implementation.

FIG. 5C illustrates a way of imparting different AC and DC bias current gains to the bias circuit 110. For example, if the impedance element 116 includes a resistor 116A and series inductor 116B, while the impedance element 118 includes only a resistor 118A, the bias circuit 110 will exhibit increasing bias current gain with increasing input signal frequency. This combination may be reversed—inductor 116B removed from 116 and inductor 118B added to 118—to effect decreasing bias current gain with increasing input signal frequency.

FIG. 5D illustrates another possible variation for the impedance element 116 (118), wherein a capacitor 116C (118C) shunts the series resistor and inductor 116A and 116B (118A and 118B), respectively. In this manner, the bias current gain of the bias circuit 110 may be further AC compensated. For example, if the impedance element 116 includes the shunt capacitor 116C, while the impedance element 118 does not include its shunt capacitor 118C, the bias circuit 110 will tend to exhibit a decreasing bias current gain with increasing input signal frequency.

Those skilled in the art will readily appreciate that either or both of the impedance elements 116 and 118 may be implemented as single passive components, or as combinations of passive components, depending upon the specific needs of a particular design. The impedance element 116 may, and oftentimes will be, implemented differently from the impedance element 118. All such variations of reactive and non-reactive circuit components are within the scope of the present invention. Further, those skilled in the art will readily appreciate that either or both of the impedance elements 116 and 118 may be implement in whole, or in part, using items other than explicit circuit components. For example, integrated circuit inter-connect tracks or bond wires may themselves impart the resistance and/or reactance needed in a particular design for either or both impedance elements 116 and 118. This flexibility of implementation for the impedance elements 116 and 118 allows current gain of the bias circuit 110 to be tailored specifically to the needs of a given design.

FIGS. 6A and 6B illustrate current flow during operation of one embodiment of an amplifier network 100 in accordance with the present invention. As earlier noted, the bias circuit 110 may be configured to operate the transistor power amplifier 106 in Class A mode for very small input signal amplitudes. Preferably, however, during large signal operation, the bias circuit 110 operates the transistor power amplifier 106 in Class AB mode. During operation, the RF input signal coupled to the signal input 102 includes both positive and negative signal swings with respect to the signal ground. As illustrated in FIG. 6A, during positive-going input signal swings, the charge on capacitor 104 discharges into the base 106B of the transistor power amplifier 106 and into the base of the first bias transistor 112. Referring to FIG. 5A, the bias circuit transistor 112 is preferably fabricated smaller than the transistor power amplifier 106, such that the transistor power amplifier 106 receives proportionally more current from the coupling capacitor 104 than does the bias circuit transistor 112. Charge dumped from the capacitor 104 during the positive-going cycle of the input signal turns on the transistor power amplifier 106. The amount of charge on the coupling capacitor 104 is proportional to the amplitude of the RF input signal applied to the input node 102 with respect to signal ground.

FIG. 6B illustrates operation during negative-going input signal swings, the bias circuit 110 must now charge the coupling capacitor 104, so that the capacitor 104 may dump charge into the base 106B of the transistor power amplifier 106 during the next positive-going input signal swing. The amount of charge pumped into the coupling capacitor 104 by the bias circuit 110 must be precisely metered, such that the ratio of bias current magnitude to input signal amplitude is maintained for a desired range of input signal amplitudes. If the bias circuit 110 is current limited, that is, if the bias circuit 110 does not have adequate current gain, it will not be able to pump enough current into the coupling capacitor 104 during the brief amount of time associated with the negative-going cycle of the input RF signal. Failure to fully recharge the coupling capacitor 104 will result in gain compression. This requirement may be particularly challenging in designs where the input signal amplitude ranges from zero or near zero amplitude at minimum output power to a comparatively large amplitude at full output power. Such large ranges of input signal amplitudes are common, for example, in CDMA cellular telephone applications, where output power is typically controlled over a 35 dB range.

General current and voltage relationships for a capacitor may be expressed as follows:

$$V_C(t) = \frac{1}{C}\int_{-\infty}^{t} i(t)\,d(t) \quad \text{and} \quad i_C(t) = C\frac{dV}{dt}$$

Where $V_c(t)$ equals the voltage across the capacitor and $i_c(t)$ equals the current through the capacitor as a function of time t. Of more particular interest than these general equations, the amount of charge on a given capacitor having capacitance measured in Farads, is given as Q=CV, where Q=charge in Coulombs, V=capacitor voltage in Volts, and C=the capacitance being charged in Farads. The following expression provides a simplified expression for charging a capacitor:

$$v(t) = v_{SOURCE}\left(1 - e^{\frac{t}{RC}}\right)$$

Where v(t) equals the capacitor voltage at time t, $v_{SOURCE}$ equals the charging voltage, R equals the source resistance of the charging voltage, and C equals the capacitance being charged. The above equation may be modified to reflect initial capacitor charge conditions and more complex circuit and signal considerations.

To deposit a desired amount of charge onto the coupling capacitor 104, the bias circuit 110 must pump sufficient current into the capacitor 104 over the time window defined by the negative-going input signal swing. Typically the time associated with the negative-going portion of the input signal is fixed by the modulation scheme and transmission frequency, leaving the charging voltage and current as free variables. Because the charging voltage is typically constrained by design and cost limitations to be the operation voltage of the associated mobile device (e.g., cellular phone), which is typically 3.6 Volts, it is important to get as much current as possible from a relatively low voltage source. The ability of the present bias circuit to operate with greater than unity current gain allows it to provide sufficient charging current to the input signal coupling capacitor 104, even at high input signal amplitudes.

Figure 7:
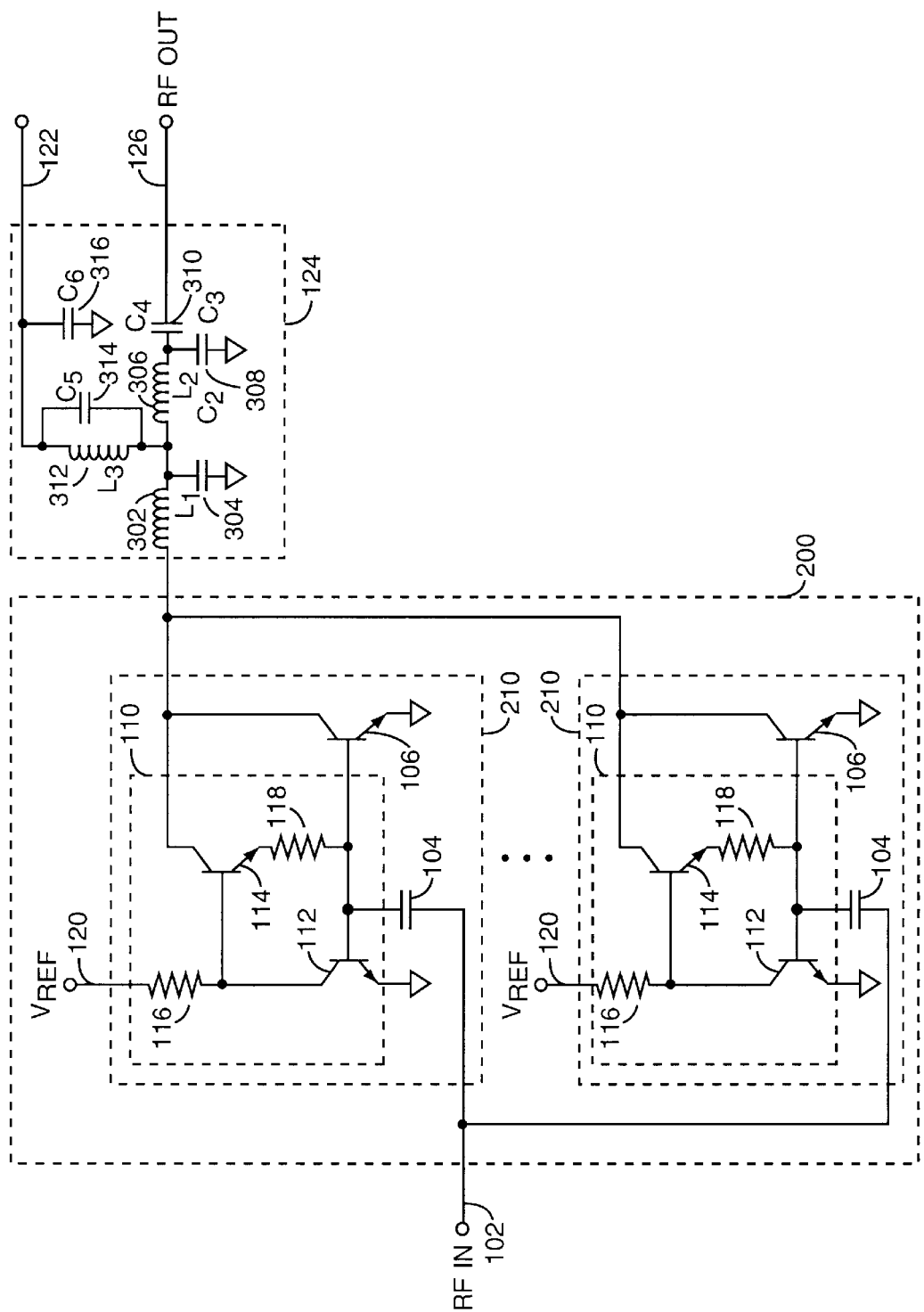
FIG. 7 illustrates an exemplary embodiment for a combined bias circuit and transistor amplifier network in accordance with the present invention.

FIG. 7 depicts an advantageous integrated circuit implementation for a bias circuit and amplifier network 200 in accordance with the present invention. The bias and amplifier network 200 comprises a plurality of parallel bias and amplifier circuits 210. This arrangement is particularly advantageous for integrated circuit fabrication techniques. Oftentimes, a given transistor power amplifier is comprised of many amplifier transistors 106 arranged in a parallel configuration with respect to a common RF input signal node 102 and a common output matching network 124. Each of these transistors 106 is paired with its own input coupling capacitor 104 and biasing circuit 110 as previously shown in FIG. 5A. One modification from the bias circuit 110 shown in FIG. 5 is the connection of each collector of the second bias transistors 114 with the collectors of corresponding transistor power amplifiers 106. This saves having to route power bus connections for the supply voltage 122 to each bias and amplifier circuit 210.

Connecting the collector of the second bias transistor 114 with the collector of the transistor power amplifier 106 works because when the RF input signal is active, the bias circuit 110 need only supply bias current for charging the coupling capacitor 104 during negative-going input signal swings, during which time the amplifier 106 is off. With an exemplary output matching network, the collector voltage of transistor 130 rises to as much as 2*VCC, providing ample voltage to the bias circuit 110 from which to obtain bias current for charging the capacitor 104.

FIG. 7 also illustrates an exemplary output-matching network 124. Inductors 302 and 306 combine with capacitors 304 and 308 to form a filter network, while capacitor 310 provides an AC-coupled connection to the RF signal output 126. The operating voltage supply 122 provides current to the output-matching network 124 through a parallel inductor 312 and capacitor 314. Capacitor 316 provides power supply filtering. Note that the inductive elements in the exemplary output matching network 124 provide a back EMF voltage boost when the transistor power amplifier 106 turns off during the negative going cycles of the input RF signal. Thus, operating voltage is available on the collector of the bias transistor 114 and allows the bias circuit 110 to recharge the input coupling capacitor 104 during the negative cycles of the input signal.

The foregoing discussion and supporting illustrations are exemplary and should not be construed as limiting the present invention. Substantial variations of the exemplary bias circuit implementations may be practiced without departing from the spirit and scope of the present invention. For example, the bias circuit examples described herein may be modified to included additional circuit elements providing temperature or voltage compensation. Further, while exemplary embodiments of the inventive bias circuit are configured to provide greater-than-unity current gain for advantageous compensation of amplifier gain compression, other bias circuit embodiments may be adjusted to have less-than-unity current gain for use with other types of power amplifiers. Those skilled in the art will readily appreciate that these and other modifications are all within the scope of the present invention. Indeed, the present invention is limited only by the scope of the claims attached hereto, and the reasonable equivalents thereof.

What is claimed is:

1. A bias circuit for biasing a transistor power amplifier, said bias circuit comprising:
   a first transistor comprising a base, a collector, and an emitter, said base of said first transistor coupled to a base of an associated amplifier transistor and a first end of an input signal coupling capacitor, and said emitter coupled to a signal ground node common with an emitter of the associated amplifier transistor;
   a second transistor comprising a base, a collector, and an emitter, said base of said second transistor coupled to said collector of said first transistor, and said collector of said second transistor coupled to an operating voltage signal; and
   a first impedance element having a first end coupled to said collector of said first transistor and said base of said second transistor and a second end coupled to a reference voltage signal;
   wherein said bias circuit is operative to provide a bias current responsive to an amplitude of the radio frequency signal to be amplified with a current gain capable of being configured to be greater than unity.

2. The bias circuit of claim 1 wherein said first impedance element comprises a first combination of resistive and reactive elements configured to provide desired DC and AC current gain characteristics for said bias circuit.

3. The bias circuit of claim 1 wherein said first impedance element is one of the group consisting of a first resistor and a first inductor.

4. The bias circuit of claim 1 wherein said first impedance element comprises a first series combination of a first inductor and a first resistor.

5. The bias circuit of claim 1 wherein said first impedance element comprises a first resistor connected in parallel with a first capacitor.

6. The bias circuit of claim 1 further comprising a second impedance element having a first end coupled to said emitter of said second transistor and a second end coupled to said base of said first transistor.

7. The bias circuit of claim 6 wherein said second impedance element comprises a second combination of resistive and reactive elements configured to provide desired DC and AC current gain characteristics for said bias circuit.

8. The bias circuit of claim 6 wherein said second impedance element is one of the group consisting of a second resistor and a second inductor.

9. The bias circuit of claim 6 wherein said second impedance element comprises a second series combination of a second inductor and a second resistor.

10. The bias circuit of claim 6 wherein said second impedance element comprises a second resistor connected in parallel with a second capacitor.

11. The bias circuit of claim 6 wherein an overall impedance value of said first impedance element and an overall impedance value of said second impedance element are adjusted for a given value of the reference voltage signal to configure the current gain of said bias circuit, and further wherein increasing the overall impedance value of said first impedance at a given operating frequency tends to increase the current gain of said bias circuit, while increasing the overall impedance value of said second impedance element at the given operating frequency tends to decrease the current gain of said bias circuit.

12. The bias circuit of claim 1 wherein said bias circuit is configured to have a bias current gain such that said bias current provides an amount of charge to said input signal coupling capacitor during negative-going portions of the radio frequency signal to be amplified sufficient to recharge said input signal coupling capacitor to a voltage proportionate to an input signal amplitude of the radio frequency signal to be amplified over a range of input signal amplitudes.

13. The bias circuit of claim 1 wherein said bias circuit is implemented in an Indium Phosphide semiconductor process technology.

14. The bias circuit of claim 1 wherein said bias circuit is implemented in a Silicon Germanium semiconductor process technology.

15. The bias circuit of claim 1 wherein said bias circuit is fabricated with a desired size ratio between said first transistor and the associated transistor power amplifier.

16. The bias circuit of claim 15 wherein said desired size ratio is such that said first transistor is smaller than the associated transistor power amplifier such that the associated transistor power amplifier receives more base current than said first transistor.

17. The bias circuit of claim 1 wherein a collector voltage of said first transistor has an amplified response to the radio frequency signal to be amplified based on a current gain of said first transistor and an impedance of said first impedance element, and wherein the collector voltage of said first transistor drives said base of said second transistor such that the bias current provided by said bias circuit may be configured with a desired current gain relative to an amplitude of the radio frequency signal to be amplified.

18. The bias circuit of claim 1 wherein said bias circuit is operative such that said first transistor turns off and said second transistor turns on during a negative-going swing of the radio frequency signal to be amplified, and said first transistor turns on and said second transistor turns off when the radio frequency signal to be amplified exceeds a given amplitude during positive-going swings of the radio frequency signal to be amplified.

19. The bias circuit of claim 18 wherein a maximum drive signal appearing on said base of said second transistor develops when said first transistor turns off.

20. A bias circuit for biasing a radio frequency amplifier, said bias circuit comprising:
a first transistor driven by a radio frequency signal to be amplified by the radio frequency amplifier and adapted to output a bias control signal responsive to the radio frequency signal to be amplified; and
a second transistor driven by said bias control signal and adapted to provide a bias current to the radio frequency amplifier responsive to said bias control signal;
wherein said bias circuit provides said bias current to the radio frequency amplifier proportional to an amplitude of the radio frequency signal to be amplified.

21. The bias circuit of claim 20 further comprising:
a first impedance element coupled between a bias voltage supply and said first transistor; and
a second impedance element coupled between said second transistor and the radio frequency power amplifier;
wherein a current gain of said bias current may be adjusted to a desired value based on setting values for said first and second impedance elements.

22. The bias circuit of claim 20 wherein said second transistor derives said bias current from an operating voltage supply.

23. The bias circuit of claim 20 wherein said second transistor derives said bias current from an output of the radio frequency amplifier.

24. A radio frequency power amplifier circuit comprising:
a first transistor having a base, a collector, and an emitter, said emitter of said first transistor coupled to a signal ground node;
a second transistor having a base, a collector, and an emitter, said collector of said second transistor coupled to a voltage source, and said base of said second transistor coupled to said collector of said first transistor;
a third transistor having a base, a collector, and an emitter, said emitter of said third transistor coupled to said signal ground node and said base of said third transistor coupled to said base of said first transistor, said collector of said third transistor providing an amplified output signal;
a first impedance element having a first end coupled to said collector of said first transistor and said base of said second transistor and a second end coupled to a reference voltage signal; and
a first capacitor having a first end coupled to a radio frequency signal to be amplified and a second end coupled to said bases of said first and third transistors;
wherein said first and second transistors and said first impedance element cooperate to form a bias circuit providing a bias current proportional to an amplitude of the radio frequency signal received through said first capacitor to be amplified by said third transistor.

25. The radio frequency power amplifier of claim 24 further comprising a second impedance element having a first end coupled to said emitter of said second transistor and a second end coupled to said bases of said first and third transistors and said second end of said first capacitor, and wherein increasing an impedance of said first impedance element tends to increase a current gain of the bias circuit, and increasing an impedance of said second impedance element tends to decrease the current gain of said bias circuit.

26. The radio frequency power amplifier of claim 25 wherein said first and second impedance elements comprise first and second resistors, respectively.

27. The radio frequency power amplifier of claim 25 wherein said first and second impedance elements each comprise first and second combinations of a series resistor and inductor, respectively.

28. The radio frequency power amplifier of claim 25 wherein said first and second impedance elements each comprise a combination of reactive and resistive components selected to impart desired DC and AC gain characteristics to the current gain of said bias circuit.

29. The radio frequency power amplifier circuit of claim 24 wherein said voltage source coupled to said collector of said second transistor is said amplified output signal taken from said collector of said third transistor.

30. The radio frequency power amplifier circuit of claim 24 further comprising an output matching network having a first connection coupled to said collector of said third transistor, a second connection coupled to a supply voltage signal, and a third connection coupled to an output load and providing a final RF output signal, said output matching network providing a desired load to said collector of said third transistor.

31. The radio frequency power amplifier circuit of claim 30 wherein said collector of said second transistor connects to said collector of said third transistor such that said amplified output signal serves as the supply voltage signal for said second transistor.

32. The radio frequency amplifier circuit of claim 24 wherein said output matching network includes one or more inductive circuit elements such that said amplified output signal increases in voltage when said third transistor turns off during negative-going excursions of the radio frequency signal to be amplified, thereby providing adequate voltage to the collector of said second transistor for generating a bias current used in charging said first capacitor.

33. The radio frequency amplifier circuit of claim 24 wherein said radio frequency amplifier circuit is implemented in an integrated circuit device.

34. An integrated circuit device comprising:
  a reference voltage node adapted to receive a reference voltage signal;
  an operating voltage node adapted to receive an operating voltage signal;
  an output signal node adapted to provide an output RF signal;
  an input signal node adapted to receive a radio frequency signal to be amplified;
  a plurality of coupling capacitors having first ends commonly connected to said input signal node;
  a plurality of parallel amplifier transistors, each having a base, an emitter, and a collector, wherein respective ones of said bases are connected to respective ones of second ends of said coupling capacitors, all said emitters are commonly connected to a signal ground node and all said collectors are commonly connected to said output signal node; and
  a plurality of bias circuits wherein respective ones of said bias circuits are connected to respective ones of said parallel amplifier transistors and adapted to provide a bias current that operates said parallel amplifier transistors in a substantially linear mode of operation over a range of amplitudes of the radio frequency signal to be amplified, each said bias circuit comprising:
    (i) a first transistor comprising a base, a collector, and an emitter, said base coupled to said base of a respective one of said amplifier transistors and said second end of a respective one of said coupling capacitors, and said emitter coupled to said signal ground node;
    (ii) a second transistor comprising a base, a collector, and an emitter, said base coupled to said collector of said first transistor, and said collector coupled to said operating voltage node; and
    (iii) a first impedance element having a first end coupled to said collector of said first transistor and said base of said second transistor and a second end coupled to said reference voltage node.

35. The integrated circuit device of claim 34 wherein each said bias circuit further comprises a second impedance element having a first end coupled to said emitter of said second transistor and a second end coupled to said base of said first transistor, said base of said respective amplifier transistor, and said second end of said respective coupling capacitor.

36. The integrated circuit device of claim 34 further comprising an output matching network having first connection coupled to said output signal node, a second connection coupled to an operating voltage signal, and a third node coupled to an output load, wherein a circuit network included in said output matching network connects said output signal node to said output load through a circuit network impedance matched to an impedance of said output load.

37. The integrated circuit device of claim 36 wherein said operating voltage node commonly connecting all said collectors of said second transistors in said plurality of bias circuits connects to said first connection of said output matching network such that said bias circuits receive said amplified output signal on said collectors of said parallel amplifier transistors as a bias circuit operating voltage signal.

38. The integrated circuit device of claim 34 further comprising a reference voltage circuit adapted to provide a reference voltage signal to said reference voltage node.

39. The integrated circuit device of claim 34 further comprising a like plurality of input resistors disposed in series between said second ends of said coupling capacitors and said bases of said parallel amplifier transistors such that respective ones of said amplifier transistors receive the radio frequency signal to be amplified through a series connection to said input signal node comprising a respective one of said coupling capacitors and a respective one of said input resistors.

40. A bias circuit for biasing a transistor power amplifier, said bias circuit comprising:
  a first transistor circuit for generating an analog control signal responsive to an amplitude of a radio frequency signal to be amplified by the transistor power amplifier; and
  a second transistor circuit for generating a bias current responsive to said analog control signal;
  wherein said bias current maintains the transistor power amplifier in a linear mode of amplification across a range of amplitudes of the radio frequency signal to be amplified.

41. The bias circuit of claim 40 wherein a signal gain of said first transistor circuit determines a relative relationship between the radio frequency signal to be amplified and the analog control signal, and wherein the signal gain of said first transistor circuit may be configured as desired such that said second transistor circuit provides a bias current with a desired bias current gain.

* * * * *